United States Patent
Kim et al.

(10) Patent No.: US 7,560,327 B2
(45) Date of Patent: Jul. 14, 2009

(54) METHOD OF FABRICATING SEMICONDUCTOR DEVICE WITH DUAL GATE STRUCTURE

(75) Inventors: Kwang-Ok Kim, Kyoungki-do (KR); Young-Kyun Jung, Kyoungki-do (KR)

(73) Assignee: Hynix Semiconductor Inc., Ichon-si (KR)

( * ) Notice: Subject to any disclaimer, the term of this patent is extended or adjusted under 35 U.S.C. 154(b) by 321 days.

(21) Appl. No.: 11/450,658

(22) Filed: Jun. 8, 2006

(65) Prior Publication Data
US 2007/0148885 A1    Jun. 28, 2007

(30) Foreign Application Priority Data
Dec. 28, 2005    (KR) ................ 10-2005-0132500

(51) Int. Cl.
*H01L 21/8238*    (2006.01)
(52) U.S. Cl. ................ 438/199; 438/532; 257/E21.637
(58) Field of Classification Search ................ 438/532, 438/551
See application file for complete search history.

(56) References Cited

U.S. PATENT DOCUMENTS

| | | | |
|---|---|---|---|
| 5,712,201 A * | 1/1998 | Lee et al. .................... 438/239 |
| 6,596,590 B1 | 7/2003 | Miura et al. | |
| 6,753,572 B2 | 6/2004 | Lee et al. | |
| 6,773,998 B1 | 8/2004 | Fisher et al. | |
| 6,780,708 B1 * | 8/2004 | Kinoshita et al. ........... 438/241 |
| 6,884,733 B1 * | 4/2005 | Dakshina-Murthy et al. .......................... 438/717 |
| 7,109,101 B1 * | 9/2006 | Wright et al. ............... 438/585 |
| 2004/0043586 A1 | 3/2004 | Ahmed et al. | |
| 2005/0056940 A1 | 3/2005 | Sandhu et al. | |

FOREIGN PATENT DOCUMENTS

| | | |
|---|---|---|
| CN | 1186334 | 7/1998 |
| JP | 07-221302 | 8/1995 |
| JP | 08-037300 | 2/1996 |
| KR | 1999-012244 | 2/1999 |
| TW | 340970 B | 9/1998 |
| TW | 416103 B | 12/2000 |
| TW | 586165 B | 5/2004 |

OTHER PUBLICATIONS

State Intellectual Property Office of the People's Republic of China, First Office Action for Chinese Patent Application No. 200610149852.2, 9 pages (May 16, 2008).

* cited by examiner

*Primary Examiner*—W. David Coleman
*Assistant Examiner*—Shaka Scarlett
(74) *Attorney, Agent, or Firm*—Townsend and Townsend and Crew LLP

(57) ABSTRACT

A method for fabricating a semiconductor device with a dual gate structure is provided. The method includes: forming a gate oxide layer over a substrate; forming a gate conductive layer over the gate oxide layer; forming an amorphous carbon layer over the gate conductive layer; forming a photosensitive pattern over the amorphous carbon layer; etching the amorphous carbon layer using the photosensitive pattern as an etch mask to form a patterned amorphous carbon layer; performing an ion implantation process using the patterned amorphous carbon layer as an ion implantation barrier to implant an impurity onto the gate conductive layer; removing the patterned amorphous carbon layer; and patterning the gate conductive layer to form a gate structure.

16 Claims, 6 Drawing Sheets

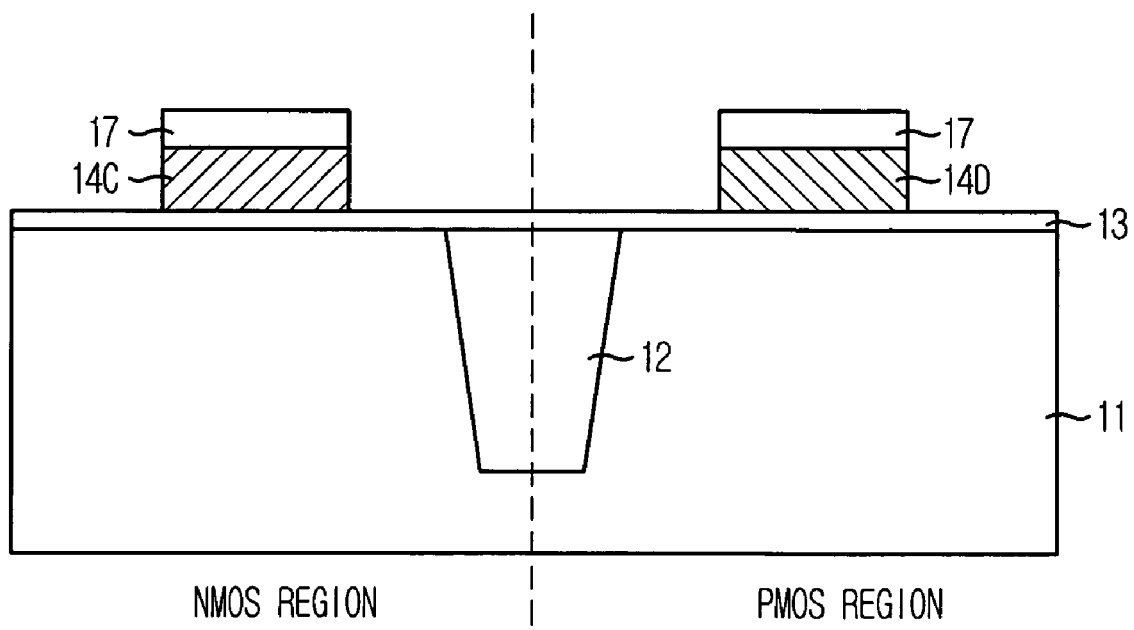

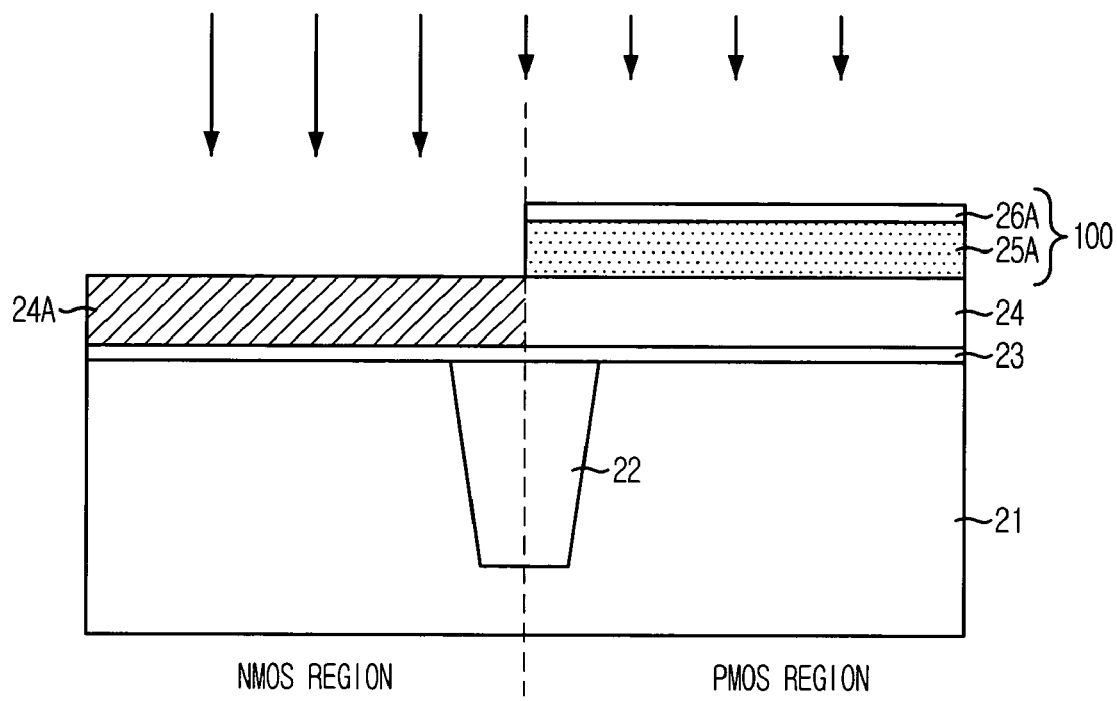
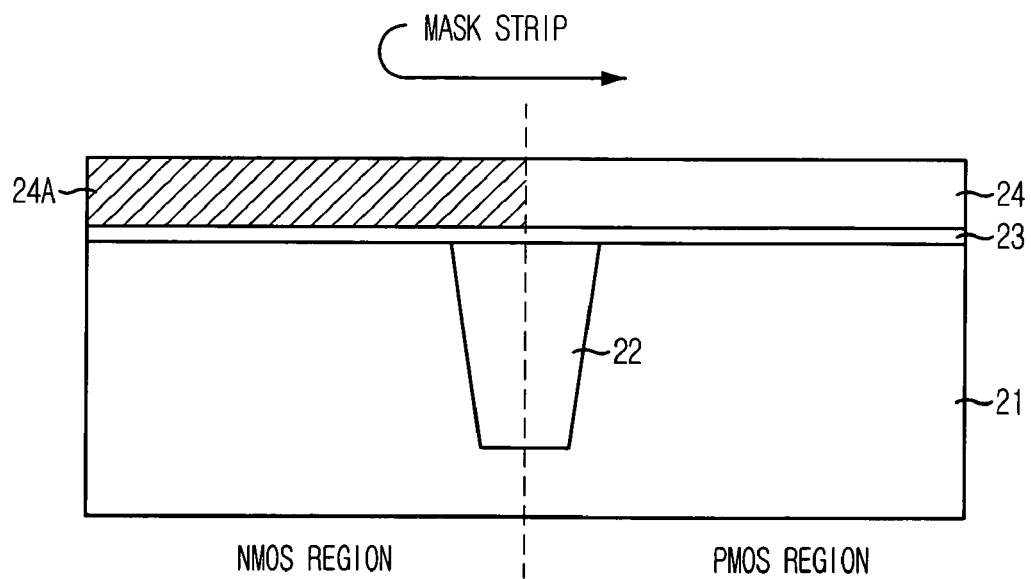

METHOD OF FABRICATING SEMICONDUCTOR DEVICE WITH DUAL GATE STRUCTURE

The present invention relates to a method for fabricating a semiconductor device; and, more particularly, to a method for fabricating a semiconductor device with a dual gate structure.

Recently, many researchers have focused on dual gates formed of polysilicon (hereinafter referred to as "dual poly-gates") to improve limitations such as a short channel effect caused by progressive decrease of a design size. In more detail, instead of using N-type impurity doped polysilicon (hereinafter referred to as "N-type doped polysilicon") in both gates of N-channel metal oxide semiconductor (NMOS) and P-channel metal oxide semiconductor (PMOS) transistors, N-type doped polysilicon and P-type impurity doped polysilicon (hereinafter referred to as "P-type doped polysilicon") are used in an NMOS transistor and a PMOS transistor, respectively.

FIGS. 1A to 1C are simplified cross-sectional views illustrating a typical method for fabricating a semiconductor device with dual poly-gates.

Referring to FIG. 1A, a device isolation layer 12 is formed in a certain region of a substrate defined into an NMOS region and a PMOS region to isolate devices. A gate oxide layer 13 and a gate polysilicon layer 14 are sequentially formed on the substrate 11. A first ion implantation process $N^+$ IMP is performed to implant an N-type impurity onto a portion of the gate polysilicon layer 14 in the NMOS region using a first mask 15, which opens the NMOS region but covers the PMOS region. The first mask 15 is formed of a photosensitive material. Herein, the portion of the gate polysilicon layer 14 doped with the N-type impurity is referred to as "N-type doped polysilicon layer 14A."

Referring to FIG. 1B, the first mask 15 is stripped, and a photosensitive layer is coated on the N-type doped polysilicon layer 14A and the gate polysilicon layer 14 and patterned through a photo-exposure and developing process to form a second mask 16, which opens the PMOS region but covers the NMOS region.

Using the second mask 16, a second ion implantation process $P^+$ IMP is performed to implant a P-type impurity onto another portion of the gate polysilicon layer in the PMOS region to form a P-type doped polysilicon layer 14B.

Referring to FIG. 1C, the second mask 16 is stripped. A tungsten silicide layer 17 is formed on the N-type doped polysilicon layer 14A and the P-type doped polysilicon layer 14B, and a gate patterning process is performed thereon to form an N-type doped poly-gate 14C in the NMOS region and a P-type doped poly-gate 14D in the PMOS region. That is, a dual poly-gate is formed.

In the above typical fabrication method, the gate polysilicon layer 14 is implanted with two different types of impurities to obtain the dual poly-gate including the N-type doped poly-gate 14C and a P-type doped poly-gate 14D. The first and second ion implantation processes $N^+$ IMP and $P^+$ IMP use a high dose of impurities ranging from $1 \times 10^{15}$ cm$^{-2}$ to $1 \times 10^{16}$ cm$^{-2}$ instead of a dose level ranging from $1 \times 10^{12}$ cm$^{-2}$ to $1 \times 10^{13}$ cm$^{-2}$.

When the first and second ion implantation processes $N^+$ IMP and $P^+$ IMP are performed, the respective first and second masks 15 and 16 are used as a photosensitive pattern. At this time, the photosensitive pattern often reflows at approximately 200° C. and tends to be weak, and thus, the photosensitive pattern is generally hardened during the first and second ion implantation processes $N^+$ IMP and $P^+$ IMP implemented with high energy.

Hence, the high dose of the impurities often results in a hardening event on an interface between the photosensitive pattern (i.e., one of the first and second masks 15 and 16) and the gate polysilicon layer 14 disposed underneath the photosensitive pattern. Thus, the photosensitive pattern is less likely to be stripped, resulting in a generation of residues on the interface. That is, even if the stripping process is performed, it may be difficult to strip the photoresist pattern due to strong adhesion between the gate polysilicon layer 14 and the first mask 15 and between the gate polysilicon layer 14 and the second mask 16. This difficulty is generally caused by an adhesion layer 18 (refer to FIGS. 1A and 1B) that is not likely to be removed due to strong adhesion. As illustrated in FIGS. 1A and 1B, the adhesion layer 18 is formed between the gate polysilicon layer 14 and the first mask 15 and between the gate polysilicon layer 14 and the second mask 16 during the first and second ion implantation processes $N^+$ IMP and $P^+$ IMP using the high dose of impurities.

Due to the residues remaining even after the stripping process, there may be poor adhesion between the dual poly-gates and the tungsten silicide layer. Thus, defective patterns such as lifted patterns may be generated after the gate patterning process.

SUMMARY OF THE INVENTION

One embodiment of the present invention relates to a method for fabricating a semiconductor device with a dual poly-gate, wherein the method allows a photosensitive pattern used in an ion implantation process to be easily stripped without remnants.

In accordance with an aspect of the present invention, there is provided a method for fabricating a semiconductor device, including: forming a gate dielectric layer over a substrate; forming a gate conductive layer over the gate dielectric layer, the gate conductive layer having first and second portions; forming an amorphous carbon layer over the gate conductive layer; forming a patterned photosensitive layer over the amorphous carbon layer, the patterned photosensitive layer exposing the first portion of the gate conductive layer, the second portion of the gate conductive layer being covered by the patterned gate conductive layer; etching the amorphous carbon layer using the patterned photosensitive layer as an etch mask to form a patterned amorphous carbon layer; performing a first ion implantation process using at least the patterned amorphous carbon layer as an ion implantation barrier to implant an impurity of a first type onto the first portion of the gate conductive layer; removing the patterned amorphous carbon layer; and patterning the gate conductive layer to form a gate structure.

In accordance with another aspect of the present invention, there is provided a method for fabricating a semiconductor device, including: forming a gate dielectric layer over a substrate having a first region and a second region; forming a gate conductive layer over the gate dielectric layer covering the first and second regions; forming a first carbon layer over the gate conductive layer; forming a first photosensitive layer provided over the first carbon layer; providing a first patterned mask exposing the first region of the substrate and covering the second region of the substrate, the first mask including the first photosensitive layer and the first carbon layer; performing a first ion implantation process using the first patterned mask to implant an impurity of a first type onto the first portion of the substrate; removing the first patterned mask; providing a second patterned mask exposing the second region of the substrate and covering the first region of the substrate that has been implanted with the impurity of the first type, the second patterned mask including a second carbon layer and a second photosensitive layer formed over the second carbon layer; performing a second ion implantation process using the second patterned mask to implant an impurity of a second type on the second portion of the substrate; removing the second patterned mask; and patterning the gate conductive layer to define a first gate structure of a first type in the first region and a second gate structure of a second type in the second region.

BRIEF DESCRIPTION OF THE DRAWINGS

FIGS. 1A to 1C are simplified cross-sectional views illustrating a typical method for fabricating a semiconductor device with a dual poly-gate; and FIGS. 2A to 2H are simplified cross-sectional views illustrating a method for fabricating a semiconductor device with a dual poly-gate in accordance with an embodiment of the present invention.

DETAILED DESCRIPTION OF THE INVENTION

Hereinafter, exemplary embodiments of the present invention will be described in detail with reference to the accompanying drawings.

FIGS. 2A to 2H are cross-sectional views illustrating a method for fabricating a semiconductor device with a dual poly-gate in accordance with an embodiment of the present invention.

Figure 1A:
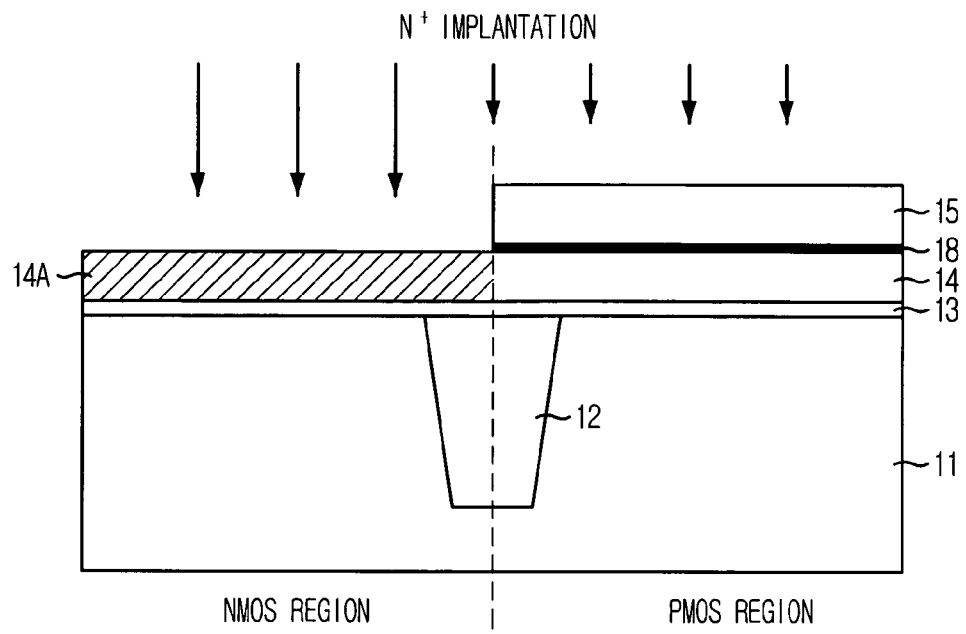
Figure 1B:
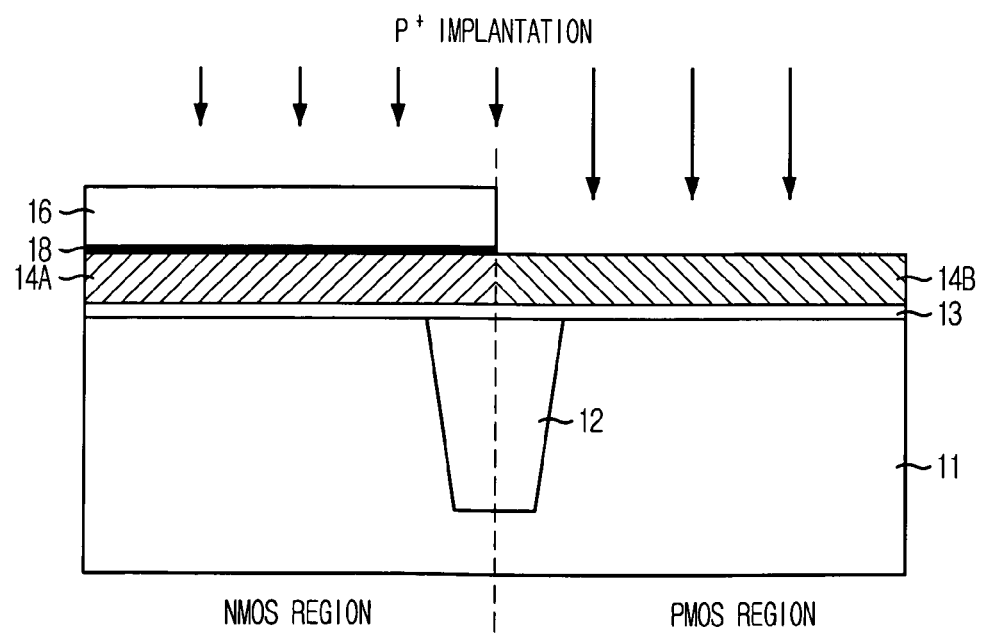
Figure 2A:
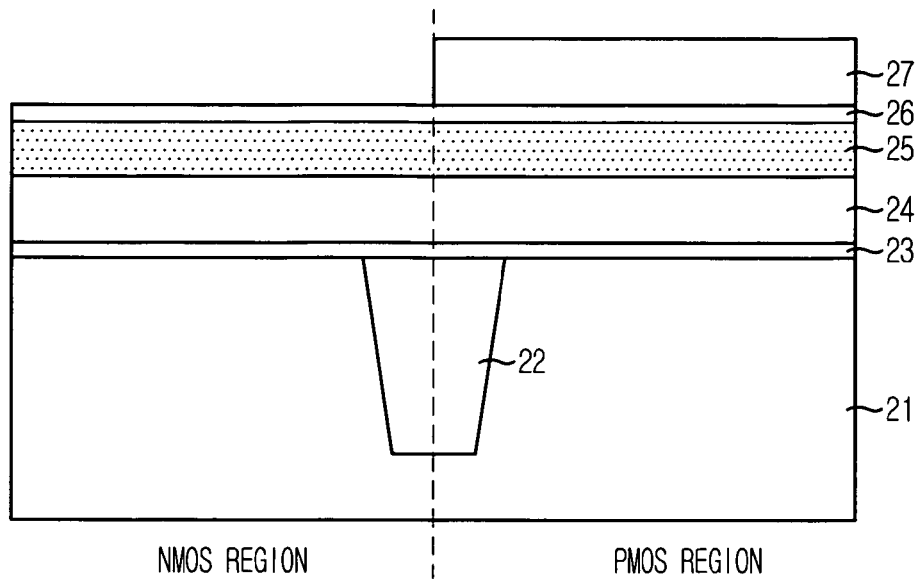

Referring to FIG. 2A, a device isolation layer 22 is formed in a substrate 21 defined into an NMOS region and a PMOS region to isolate the NMOS region and the PMOS region from each other. A shallow trench isolation (STI) method is employed to form the device isolation layer 22. A gate oxide layer 23 (or gate dielectric layer) and a gate polysilicon layer 24 are sequentially formed over the substrate 21.

A first amorphous carbon layer 25 (or first carbon layer) is formed over the gate polysilicon layer 24. Since the first amorphous carbon layer 25 can be easily removed as like a photosensitive material and aids other materials not to be etched when an etching process is performed, the first amorphous carbon layer 25 is used as a barrier for high dose ion implantation. The first amorphous carbon layer 25 is more dense than the typical photosensitive material that tends to be porous. Compared with the typical photosensitive material, the first amorphous carbon layer 25 can be obtained using a deposition method, performed at approximately 400° C. to approximately 600° C., to reduce implantation of an impurity to a bottom structure. When the first amorphous carbon layer 25 is formed in a thickness less than approximately 1,000 Å, the impurity is more likely to penetrate to the bottom structure, and thus, the thickness of the first amorphous carbon layer 25 is set to be larger than at least approximately 1,000 Å.

A first dielectric layer 26 (or first intermediate dielectric layer) is formed over the first amorphous carbon layer 25. The first dielectric layer 26 serves as a first barrier against the ion implantation over the first amorphous carbon layer 25. For this effect, the first dielectric layer 26 is formed to have a thickness larger than approximately 300 Å. The first dielectric layer 26 includes an oxide material, silicon nitride (SiON) and a nitride material. Particularly, the first dielectric layer 26 may include SiON.

A photosensitive layer is coated over the first dielectric layer 26 and patterned through a photo-exposure and developing process to form a first photosensitive pattern 27, which opens the NMOS region but covers the PMOS region.

Figure 2B:
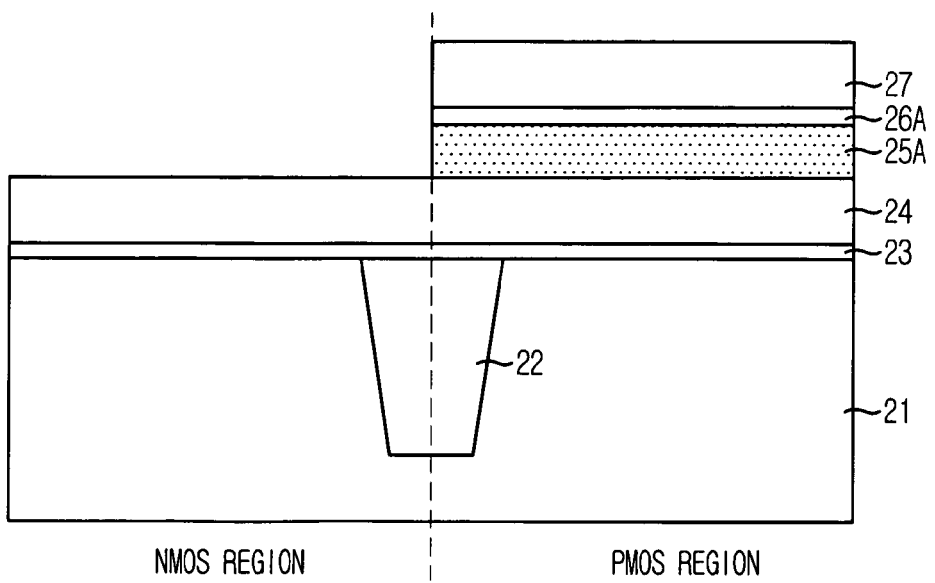

Referring to FIG. 2B, the first dielectric layer 26 and the first amorphous carbon layer 25 are etched using the first photosensitive pattern 27 to make a portion of the first dielectric layer 26 and the first amorphous carbon layer 25 remain in the PMOS region. Reference numerals 25A and 26A denote the remaining first amorphous carbon layer and the remaining first dielectric layer, respectively. Particularly, when the first amorphous carbon layer 25A is etched, the first photosensitive pattern 27 is also removed.

Referring to FIG. 2C, in the case that the first photosensitive pattern 27 remains, the first photosensitive pattern 27 is stripped using oxygen plasma. Since the remaining first dielectric layer 26A can secure a certain level of selectivity as remaining over the remaining first amorphous carbon layer 25A, the remaining first amorphous carbon layer 25A is not damaged. Therefore, a first mask 100 including the remaining first amorphous carbon layer 25A and the remaining first dielectric layer 26A is formed in the PMOS region. Particularly, the remaining first dielectric layer 26A serves as a barrier against ion implantation to the remaining first amorphous carbon layer 25A.

Using the first mask 100, a first ion implantation process $N^+$ IMP is performed to implant an N-type impurity onto the gate polysilicon layer 24 in the NMOS region. As a result, an N-type doped polysilicon layer 24A is formed. The N-type impurity may be phosphorus or arsenic, and the first ion implantation process $N^+$ IMP uses a high dose of the N-type impurity ranging from approximately $1 \times 10^{15}$ cm$^{-2}$ to approximately $1 \times 10^{16}$ cm$^{-2}$.

However, since the remaining first amorphous carbon layer 25A is a dense material different from the first photosensitive pattern 27, the N-type impurity is less likely to penetrate into the remaining first amorphous carbon layer 25A. Particularly, as mentioned above, the penetration of the N-type impurity becomes difficult since the remaining first dielectric layer 26A functions as the barrier against the first ion implantation process $N^+$ IMP.

Referring to FIG. 2D, the first mask 100 is stripped. In more detail, the remaining first dielectric layer 26A is stripped using a dry or wet etching process, and the remaining first amorphous carbon layer 25A is stripped using oxygen plasma. The remaining first amorphous carbon layer 25A includes a material that can be easily removed by the oxygen plasma similar to the first photosensitive pattern 27.

Figure 2E:
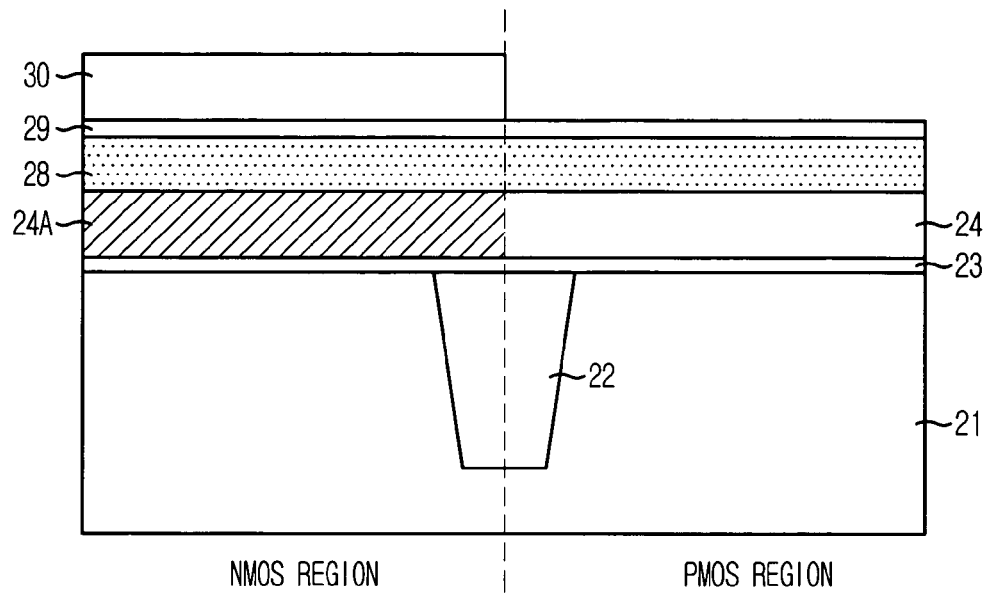

Referring to FIG. 2E, a second amorphous carbon layer 28 is formed over the N-type doped polysilicon layer 24A and the gate polysilicon layer 24. The second amorphous carbon layer 28 is substantially identical to the first amorphous carbon layer 25, and thus being easily removable as like a photosensitive material. When an etching process is performed, the second amorphous carbon layer 28 helps other materials not to be etched. Thus, the second amorphous carbon layer 28 is used as a barrier against high dose ion implantation. The second amorphous carbon layer 28 is a dense material different from the photosensitive material having a porous layer characteristic.

A second dielectric layer 29 (or second intermediate dielectric layer) is formed over the second amorphous carbon layer 28. The second dielectric layer 29 serves as a barrier against the ion implantation. For this effect, the second dielectric layer 29 is formed to be thicker than approximately 300 Å. The second dielectric layer 29 includes an oxide material, SiON or a nitride material. Particularly, the second dielectric layer 29 may include SiON.

Another photosensitive layer is coated over the second dielectric layer 29 and patterned through a photo-exposure and developing process to form a second photosensitive pattern 30, which opens the PMOS region but covers the NMOS region.

Figure 2F:
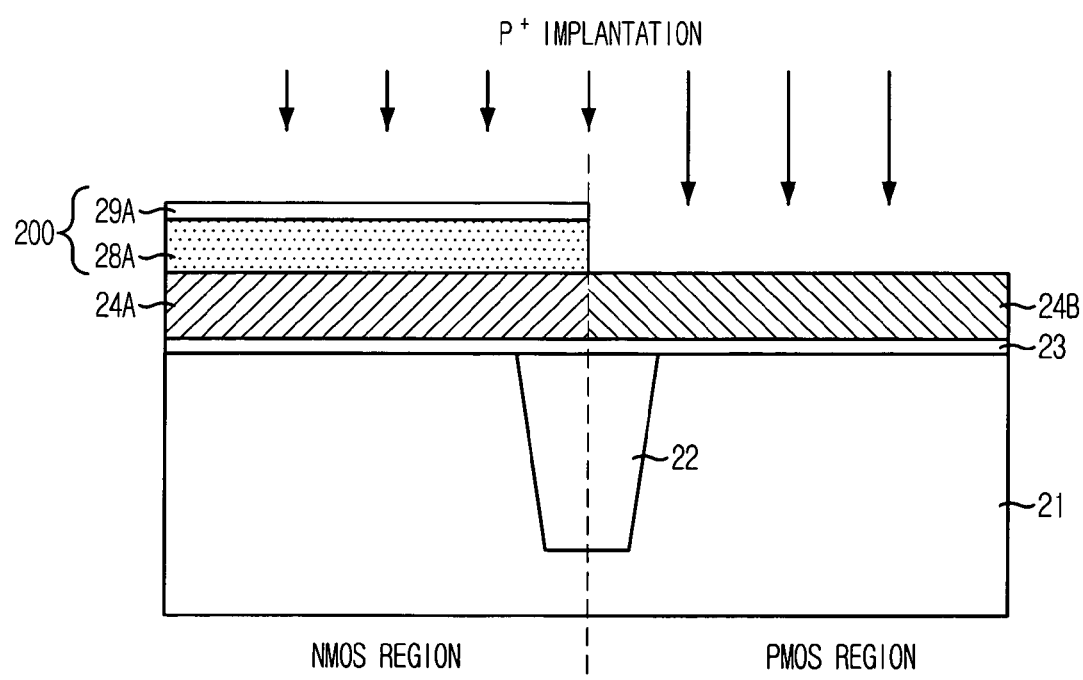

Referring to FIG. 2F, using the second photosensitive pattern 30, the second dielectric layer 29 and the second amorphous carbon layer 28 are etched to make a portion of the second dielectric layer 29 and the second amorphous carbon layer 28 in the NMOS region to remain. Reference numerals 29A and 28A denote the remaining second dielectric layer and the remaining second amorphous carbon layer, respectively. When the second amorphous carbon layer 28A is etched, the second photosensitive pattern 30 is also removed.

If the second photosensitive pattern 30 remains, the second photosensitive pattern 30 is stripped using oxygen plasma. Since the remaining second dielectric layer 29A can secure a certain level of selectivity by remaining over the remaining second amorphous carbon layer 28A, the remaining second amorphous carbon layer 28A is not damaged. Therefore, a second mask 200 including the remaining second amorphous carbon layer 28A and the remaining second dielectric layer 29A is formed in the NMOS region. Particularly, the remaining second dielectric layer 29A serves as a barrier against ion implantation to the remaining second amorphous carbon layer 28A.

Using the second mask 100, a second ion implantation process P+ IMP is performed to implant a P-type impurity onto the gate polysilicon layer 24 in the PMOS region. As a result, a P-type doped polysilicon layer 24B is formed. The P-type impurity may be boron (B) or boron difluoride ($BF_2$), and the second ion implantation process P+ IMP uses a high dose of the P-type impurity ranging from approximately $1 \times 10^{15}$ cm$^{-2}$ to approximately $1 \times 10^{16}$ cm$^{-2}$.

However, since the remaining second amorphous carbon layer 28A is a dense material different from the second photosensitive pattern 30, the P-type impurity is less likely to penetrate into the remaining second amorphous carbon layer 28A. Particularly, the penetration of the P-type impurity becomes difficult since the remaining second dielectric layer 29A functions as the barrier against the second ion implantation process P+ IMP.

Figure 2G:
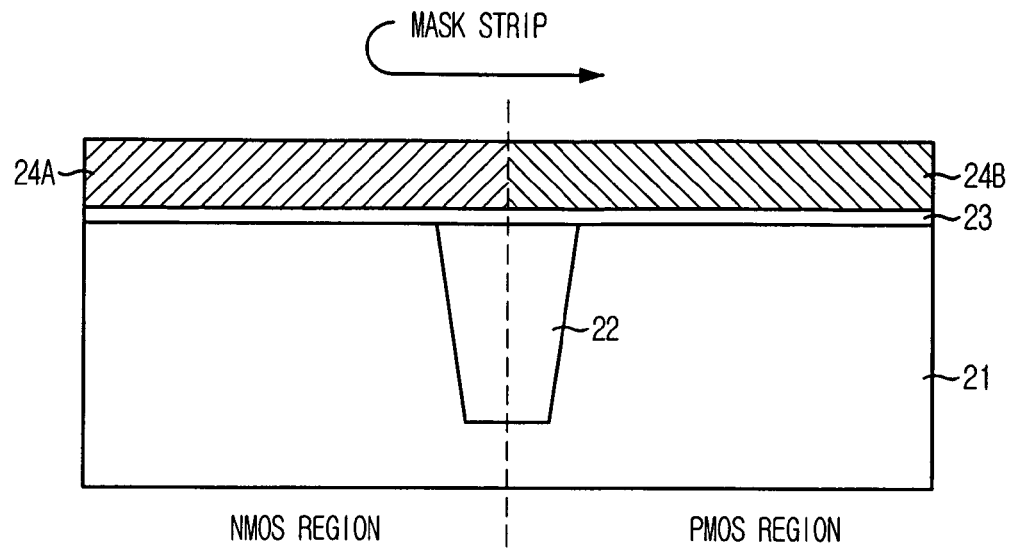

Referring to FIG. 2G, the second mask 100 is stripped. In more detail, the remaining second dielectric layer 29A is stripped using a dry or wet etching process, and the remaining second amorphous carbon layer 28A is stripped using oxygen plasma. Similar to the second photosensitive pattern 30, the remaining second amorphous carbon layer 28A includes a material that can be easily removed by the oxygen plasma.

After the second mask 200 is stripped, the gate oxide layer 23 and the N-type doped polysilicon layer 24A are formed over a portion of the substrate 21 in the NMOS region, while the gate oxide layer 23 and the P-type doped polysilicon layer 24B are formed over another portion of the substrate 21 in the PMOS region.

Figure 2H:
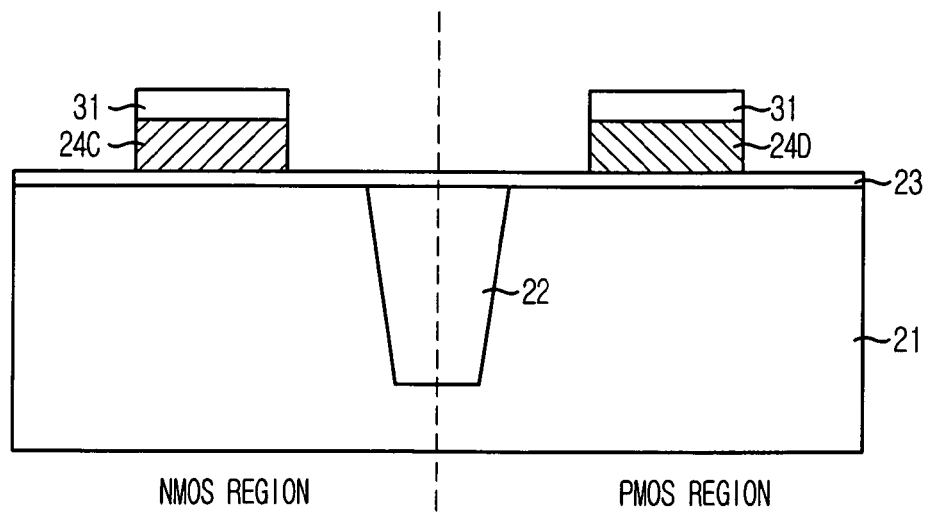

Referring to FIG. 2H, although not illustrated, a tungsten silicide layer is formed over the N-type doped polysilicon layer 24A and the P-type doped polysilicon layer 24B and then, is subjected to a gate patterning process to form a gate structure including a N-type doped poly-gate 24C and the patterned tungsten silicide layer 31 in the NMOS region and another gate structure including a P-type doped poly-gate 24D and the patterned tungsten silicide layer 31 in the PMOS region.

According to the exemplary embodiment of the present invention, an amorphous carbon layer and a dielectric layer are employed as a hard mask functioning as a barrier against an ion implantation process. The amorphous carbon layer is denser than a typical photosensitive material, and thus, the amorphous carbon layer can function as the barrier against the ion implantation process. Also, when the amorphous carbon layer is employed as a photosensitive layer, residues, which often remains after the photosensitive layer is stripped, is less likely to be generated. Hence, generation of defective patterns can be reduced.

In addition to the amorphous carbon layer, the hard mask material can be tungsten, polysilicon or an oxide material. However, using these hard mask materials except for the amorphous carbon layer requires a high temperature process and elongates a process time. Also, it is often difficult to remove these hard mask materials. Different from the amorphous carbon layer, the aforementioned hard mask materials can be removed via a typical photoresist stripping process, necessitating an additional removal process. Shortly, the manufacturing process becomes complicated and elongated, resulting damage to a bottom structure.

Although the dual poly-gate is exemplified in the present embodiment, other gate conductive materials can be employed to form a dual gate, and the fabrication method according to the present embodiment can be implemented to those processes of implanting an impurity onto a conductive layer using the photosensitive material as a barrier against the ion implantation process.

Particularly, since the amorphous carbon layer allows stripping of the photosensitive material, which is employed in the ion implantation process using a high does of the impurity to form the dual poly-gate, subsequent processes can be carried out stably, thereby increasing device yield.

The present application contains subject matter related to the Korean patent application No. KR 2005-0132500, filed in the Korean Patent Office on Dec. 28, 2005, the entire contents of which being incorporated herein by reference.

While the present invention has been described with respect to certain exemplary embodiments, it will be apparent to those skilled in the art that various changes and modifications may be made without departing from the spirit and scope of the invention as defined in the following claims.

What is claimed is:

1. A method for fabricating a semiconductor device, the method comprising:

forming a gate dielectric layer over a substrate;

forming a gate conductive layer over the gate dielectric layer, the gate conductive layer having a first portion and a second portion;

forming a first amorphous carbon layer over the gate conductive layer, wherein the first amorphous layer comprises a first portion and a second portion;

forming a first patterned photosensitive layer over the first amorphous carbon layer, the first patterned photosensitive layer exposing the first portion of the first amorphous carbon layer, the second portion of the first amorphous carbon layer being covered by the first patterned photosensitive layer;

etching the first amorphous carbon layer using the first patterned photosensitive layer as an etch mask to form a patterned first amorphous carbon layer, wherein the patterned amorphous carbon layer exposes the first portion of the gate conductive layer and covers the second portion of the conductive layer;

stripping the first patterned photosensitive layer;

performing a first ion implantation process using at least the patterned first amorphous carbon layer as an ion implantation barrier to implant an impurity of a first type onto the first portion of the gate conductive layer;

removing the first patterned amorphous carbon layer;

forming a second amorphous carbon layer over the gate conductive layer, wherein the second amorphous carbon layer comprises a first portion and a second portion; forming a second patterned photosensitive layer over the second amorphous carbon layer, the second patterned photosensitive layer exposing the second portion of the second amorphous carbon layer, the first portion of the second amorphous carbon layer being covered by the second patterned photosensitive layer; etching the second amorphous carbon layer using the second patterned photosensitive layer as an etch mask to form a second patterned amorphous carbon layer, wherein the second patterned amorphous carbon layer exposes the second portion of the gate conductive layer and covers the first portion of the gate conductive layer; stripping the second patterned photosensitive layer; performing a second ion implantation process using at least the second patterned amorphous carbon layer to implant an impurity of a second type onto the second portion of the gate conductive layer;

performing a second ion implantation process using at least the patterned amorphous carbon layer to implant an impurity of a second type onto the second portion of the gate conductive layer;

removing the second patterned amorphous carbon layer; and patterning the gate conductive layer to form a gate structure.

2. The method of claim 1, further comprising forming a first intermediate dielectric layer over the first amorphous carbon layer prior to forming the first patterned photosensitive layer; and forming a second intermediate dielectric layer over the second amorphous carbon layer prior to forming the second patterned Photosensitive layer.

3. The method of claim 2, wherein the first and second intermediate dielectric layers each includes one selected from the group consisting of an oxide based material, a nitride based material and silicon oxynitride (SiON).

4. The method of claim 3, wherein the first and second intermediate dielectric layers are each is formed to be thicker than at least approximately 300 Å.

5. The method of claim 1, wherein the first and second amorphous carbon layers are each is formed at approximately 400° C. to approximately 600° C.

6. The method of claim 1, wherein the first and second amorphous carbon layers are each is formed to be thicker than at least approximately 1,000 Å.

7. The method of claim 1, wherein each stripping process uses oxygen plasma.

8. The method of claim 1, wherein the gate conductive layer includes polysilicon.

9. The method of claim 8,
wherein the first and second types are N-type and P-type impurities, respectively.

10. A method for fabricating a semiconductor device, comprising:

forming a gate dielectric layer over a substrate having a first region and a second region;

forming a gate conductive layer over the gate dielectric layer covering the first and second regions;

forming a first carbon layer over the gate conductive layer;

forming a first photosensitive layer provided over the first carbon layer;

providing a first patterned mask exposing the first region of the gate conductive layer and covering the second region of the gate conductive layer, the first patterned mask including the first photosensitive layer and the first carbon layer;

performing a first ion implantation process using the first patterned mask to implant an impurity of a first type onto the first portion of the substrate;

removing the first patterned mask;

forming a second carbon layer over the gate conductive layer;

forming a second photosensitive layer provided over the second carbon layer;

providing a second patterned mask exposing the second region of the gate conductive layer and covering the first region of the gate conductive layer that has been implanted with the impurity of the first type, the second patterned mask including a second carbon layer and a second photosensitive layer;

performing a second ion implantation process using the second patterned mask to implant an impurity of a second type on the second portion of the substrate;

removing the second patterned mask; and patterning the gate conductive layer to define a first gate structure of a first type in the first region and a second gate structure of a second type in the second region.

11. The method of claim 10, wherein the gate conductive layer includes polysilicon, wherein the impurity of the first type is an N-type impurity and the impurity of the second type is a P-type impurity, wherein the first and second carbon layers are amorphous layers.

12. The method of claim 10, wherein the first patterned mask includes a first intermediate dielectric layer provided between the first carbon layer and the first photosensitive layer.

13. The method of claim 12, wherein the first dielectric layer includes one selected from the group consisting of an oxide based material, a nitride based material and silicon oxynitride (SiON).

14. The method of claim 13, wherein the first intermediate dielectric layer is formed to be thicker than at least approximately 300 Å.

15. The method of claim 10, wherein each of the first and second carbon layers is formed at approximately 400° C. to approximately 600° C.

16. The method of claim 10, wherein each of the first and second carbon layers is formed to be thicker than at least approximately 1,000 Å.

* * * * *